United States Patent
Balakirshnan et al.

(10) Patent No.: US 6,229,366 B1
(45) Date of Patent: May 8, 2001

(54) OFF-LINE CONVERTER WITH INTEGRATED SOFTSTART AND FREQUENCY JITTER

(75) Inventors: Balu Balakirshnan; Alex Djenguerian, both of Saratoga; Leif Lund, San Jose, all of CA (US)

(73) Assignee: Power Integrations, Inc., Sunnyvale, CA (US)

( * ) Notice: Subject to any disclaimer, the term of this patent is extended or adjusted under 35 U.S.C. 154(b) by 0 days.

(21) Appl. No.: 09/573,081

(22) Filed: May 16, 2000

Related U.S. Application Data

(62) Division of application No. 09/080,774, filed on May 18, 1998, now Pat. No. 6,107,851.

(51) Int. Cl.[7] .................................................. H03K 3/017
(52) U.S. Cl. ......................... 327/172; 327/143; 327/531; 327/544
(58) Field of Search ..................................... 327/142, 143, 327/172, 173, 174, 175, 176, 530, 531, 544

(56) References Cited

U.S. PATENT DOCUMENTS

| | | | |
|---|---|---|---|
| 3,491,252 | 1/1970 | Petrohilos | 307/229 |
| 3,555,399 | 1/1971 | Buchanan et al. | 321/43 |
| 3,840,797 | 10/1974 | Aggen et al. | 321/2 |

(List continued on next page.)

FOREIGN PATENT DOCUMENTS

| | | |
|---|---|---|
| 0 651 440 A1 | 5/1995 | (EP) . |
| 0 694 966 A1 | 1/1996 | (EP) . |
| 0 736 957 A1 | 10/1996 | (EP) . |

(List continued on next page.)

OTHER PUBLICATIONS

H.S. Hoffman, Jr., "Self–Generated Bias Supply", IBM Technical Discluser Bulletin, vol. 20, No. 5, Oct. 1997, pp. 1814–4.

H.S. Hoffman, Jr. et al, "Proportional Drive Supply with Divesion Control". IBM Techinical Disclosure Bulletin, vol. 21, No. 12, May 1979, pp. 4904–4905.

A. Halperin, "Primary Regulated Dual Power Supply", IBM Techinical Disclosure Bulletin, vol. 21, No. 10, Mar. 1979m pp. 4299–4300.

"5–W dc–dc converters aim at telecomm applications", Elcetronic Design vol. 31, No. 15, Jul. 21, 1983 pp 227.

"Combined Switch–Mode Power Amplifier and Supply", IBM Technical Disclosure Bulletin, vol. 28, No. 3, Aug. 1985, pp. 1193–1195.

R. Bruckner, et al., "Optimizing Converter Design and Performance Utilizing Micro Controller System Feedback Control", Proceedings of Powercon 8, E–2, 1981, pp 1–10.

B. Pelly et al., OPower MOSFETs take the load off switching supply design, Electronic Design, Feb. 1983, pp 135–139.

(List continued on next page.)

*Primary Examiner*—Jeffrey Zweizig
(74) *Attorney, Agent, or Firm*—Blakely Sokoloff Taylor & Zafman, LLP

(57) ABSTRACT

A pulse width modulated switch comprises a first terminal, a second terminal, and a switch that allows a signal to be transmitted between the first terminal and the second terminal according to a drive signal provided at a control input. The pulse width modulated switch also comprises a frequency variation circuit that provides a frequency variation signal and an oscillator that provides an oscillation signal having a frequency of that varies within a frequency range according to the frequency variation signal. The oscillator further provides a maximum duty cycle signal comprising a first state and a second state. The pulse width modulated switch further comprises a drive circuit that provides the drive signal when the maximum duty cycle signal is in the first state and a magnitude of the oscillation signal is below a variable threshold level.

18 Claims, 9 Drawing Sheets

U.S. PATENT DOCUMENTS

| | | | |
|---|---|---|---|
| 3,916,224 | 10/1975 | Daniels et al. | 307/264 |
| 4,072,965 | 2/1978 | Kondo | 354/51 |
| 4,143,282 | 3/1979 | Berard, Jr. et al. | 307/43 |
| 4,228,493 | 10/1980 | de Sartre et al. | 363/56 |
| 4,236,198 | 11/1980 | Ohsawa et al. | 363/49 |
| 4,495,554 | 1/1985 | Simi et al. | 363/21 |
| 4,559,590 | 12/1985 | Davidson | 363/21 |
| 4,622,627 | 11/1986 | Rodriguez et al. | 363/37 |
| 4,695,936 | 9/1987 | Whittle | 363/21 |
| 4,706,176 | 11/1987 | Kettschau | 363/21 |
| 4,706,177 | 11/1987 | Josephson | 363/24 |
| 4,720,641 | 1/1988 | Faini | 307/18 |
| 4,725,769 | 2/1988 | Cini et al. | 323/283 |
| 4,734,839 | 3/1988 | Barthold | 363/16 |
| 4,739,462 | 4/1988 | Farnsworth et al. | 363/21 |
| 4,806,844 | 2/1989 | Claydon et al. | 323/311 |
| 4,809,148 | 2/1989 | Barn | 363/20 |
| 4,811,184 | 3/1989 | Koninsky et al. | 363/17 |
| 4,814,674 | 3/1989 | Hrassky | 318/254 |
| 4,858,094 | 8/1989 | Barlage | 363/21 |
| 4,862,339 | 8/1989 | Inou et al. | 363/21 |
| 4,866,590 | 9/1989 | Odaka et al. | 363/49 |
| 4,870,555 | 9/1989 | White | 363/21 |
| 4,887,199 | 12/1989 | Whittle | 363/49 |
| 4,888,497 | 12/1989 | Dallabora et al. | 307/272.3 |
| 4,890,210 | 12/1989 | Meyers | 363/21 |
| 4,928,220 | 5/1990 | White | 363/56 |
| 4,937,728 | 6/1990 | Leonardi | 363/97 |
| 4,943,907 | 7/1990 | Cardwell, Jr. | 363/97 |
| 5,012,401 | 4/1991 | Barladge | 363/97 |
| 5,014,178 | 5/1991 | Balakrishnan | 363/49 |
| 5,021,937 * | 6/1991 | Cohen | 363/41 |
| 5,034,871 | 7/1991 | Okamoto et al. | 363/15 |
| 5,041,956 | 8/1991 | Marinus | 363/21 |
| 5,072,353 | 12/1991 | Feldkeller | 363/20 |
| 5,086,364 | 2/1992 | Leipold et al. | 361/18 |
| 5,146,394 | 9/1992 | Ishii et al. | 363/16 |
| 5,161,098 | 11/1992 | Balakrishnan | 363/144 |
| 5,177,408 | 1/1993 | Marques | 315/291 |
| 5,200,886 | 4/1993 | Schwarz et al. | 363/49 |
| 5,245,526 * | 9/1993 | Balakrishnan et al. | 363/97 |
| 5,297,014 | 3/1994 | Saito et al. | 363/21 |
| 5,313,381 | 5/1994 | Balakrishnan | 363/147 |
| 5,394,017 | 2/1995 | Catano et al. | 307/66 |
| 5,452,195 | 9/1995 | Lehr et al. | 363/21 |
| 5,461,303 | 10/1995 | Leman et al. | 323/222 |
| 5,481,178 | 1/1996 | Wilcox et al. | 323/287 |
| 5,508,602 | 4/1996 | Borgato et al. | 323/222 |
| 5,528,131 | 6/1996 | Marty et al. | 323/901 |
| 5,552,746 | 9/1996 | Danstrom | 327/427 |
| 5,563,534 | 10/1996 | Rossi et al. | 327/77 |
| 5,568,084 | 10/1996 | McClure et al. | 327/538 |
| 5,570,057 | 10/1996 | Palara | 327/369 |
| 5,572,156 | 11/1996 | Diazzi et al. | 327/109 |
| 5,617,016 | 4/1997 | Borghi et al. | 323/284 |
| 5,619,403 | 4/1997 | Ishikawa et al. | 363/21 |
| 5,621,629 | 4/1997 | Hemminger et al. | 363/56 |
| 5,640,317 | 6/1997 | Lei | 363/49 |

FOREIGN PATENT DOCUMENTS

| | | |
|---|---|---|
| 0 740 491 A1 | 10/1996 | (EP) . |
| 0 748 034 A1 | 12/1996 | (EP) . |
| 0 748 035 A1 | 12/1996 | (EP) . |
| 0 751 621 A1 | 1/1997 | (EP) . |
| WO 83/01157 | 3/1983 | (WO) . |

OTHER PUBLICATIONS

D. Azzis et al, "Flyback on Card Power Sypply", IBM Technical Disclosure Bulletin, vol. 23, No. 4, Sep. 1980, pp. 1477–1478.

A.J. Bowen et al., "Power Supply with Optical Isolator", IBM Technical Disclosure Bulletin vol. 14, No. 11, Apr. 1972, pp. 3320.

"Off–Line Power Supply Control Technique Using a Single Transformer to Feed Back Three Control Signals", IBM Technical Disclosure Bulletin, vol. 32, No. 8A, Jan. 1990, pp. 272–273.

* cited by examiner

OFF-LINE CONVERTER WITH INTEGRATED SOFTSTART AND FREQUENCY JITTER

CROSS-REFERENCE TO RELATED APPLICATION

This is a Divisional of U.S. application Ser. No. 09/080,774, filed May 18, 1998, now U.S. Pat. No. 6,107,851.

BACKGROUND

1. Field of the Invention

The field of the present invention pertains to the field of power supplies and among other things to the regulation of power supplies.

2. Background of the Invention

Power supplies that convert an AC mains voltage to a DC voltage for use by integrated electronic devices, amongst other devices, are known. The power supplies are required to maintain the output voltage, current or power within a regulated range for efficient and safe operation of the electronic device. Switches that operate according a pulse width modulated control to maintain the output voltage, current, or power of the power supply within a regulated range are also known. These switches utilize an oscillator and related circuitry to vary the switching frequency of operation of the switch, and therefore regulated the power, current or voltage that is supplied by the power supply.

A problem with utilizing pulse width modulated switches is that they operate at a relatively high frequency compared to the frequency of the AC mains voltage, which results in a high frequency signal being generated by the power supply. This high frequency signal is injected back into the AC mains input and becomes a component of the AC mains signal. The high frequency signals are also radiated by the power supply as electromagnetic waves. These high frequency signals add to the Electromagnetic Interference (EMI) of the power supply, and in fact are the largest contributors to the EMI of the power supply. The EMI generated by the power supply can cause problems for communications devices in the vicinity of the power supply and the high frequency signal which becomes a component of the AC mains signal will be provided to other devices in the power grid which also causes noise problems for those devices. Further, the radiated EMI by the power supply can interfere with radio and television transmissions that are transmitted over the air by various entities.

To combat the problem of EMI, several specifications have been developed by the Federal Communications Commission (FCC) in the United States and the European Community (EC) have established specification that specify the maximum amount of EMI that can be produced by classes of electronic devices. Since power supplies generate a major component of the EMI for electronic devices, an important step in designing a power supply is minimizing the EMI provided by the power supply to levels with the acceptable limits of the various standards. Since, a power supply can be utilized in many different countries of the world, the EMI produced should be within the most stringent limits worldwide to allow for maximum utilization of the power supply.

A known way of minimizing the EMI provided by the power supply is by adding an EMI filter to the input of the power supply. An EMI filter generally utilizes at least one inductor, capacitor and resistor in combination. However, the greater EMI produced by the power supply the larger the components that are utilized as part of the EMI filter. The cost of the EMI filter is in large part determined by the size of the inductor and capacitor utilized. The longer the components, the higher the cost of the power supply. Further, simply utilizing an EMI filter does not address the radiated EMI.

Another problem associated with pulse width modulated switches results from operation of the power supply at start up. At start up, the voltage, current and power at the output of the power supply will essentially be zero. The pulse width modulated switch will then conduct for the maximum possible amount of time in each cycle of operation. The result of this is a maximum inrush current into the power supply. The maximum inrush current is greater than the current that is utilized during normal operation of the power supply. The maximum inrush current stresses the components of power supply and switch. Stress is specifically a problem for the switch, or transistor, the transformer of the power supply, and the secondary side components of the power supply. The stress caused by the maximum inrush current decreases the overall life of the power supply and increases the cost of the power supply because the maximum rating of the components used in the power supply to not destruct from the inrush currents will be greater than the maximum rating required for normal operation.

Further, when the pulse width modulated switch conducts for the maximum possible amount of time in each cycle of operation the voltage, current and power at the output of the power supply rise rapidly. Since the feedback circuit of the power supply often does not respond as fast as the operating frequency of the switch, the rapid rise of the voltage, current and power will often result in an overshoot of the maximum voltage in the regulation range which will cause damage to the device being supplied power by the power supply.

Referring to FIG. 1 a known power supply that attempts to minimize EMI and reduce startup stress is depicted. A rectifier 10 rectifies the filtered AC mains voltage 5, from EMI filter 120, input by the AC mains to generate a rectified voltage 15. Power supply capacitor 20 then generates a substantially DC voltage with a ripple component. The rectified voltage 15 with ripple component is provided to the primary winding 35 of transformer 40 that is used to provide power to secondary winding 45. The output of secondary winding 45 is provided to secondary rectifier 50 and secondary capacitor 55 that provide a secondary DC voltage 60 at the power supply output 65 to the device that is coupled to the power supply.

In order to maintain the secondary DC voltage within a regulate range a feedback loop including an optocoupler 70, zener diode 75 and a feedback resistor 80 provides a signal indicative of the voltage at the power supply output 65 to feedback pin 85 of pulse width modulated switch 90. The voltage magnitude at the feedback terminal is utilized to vary the duty cycle of a switch coupled between the drain terminal 95 and common terminal 100 of the pulse width modulated switch 90. By varying the duty cycle of the switch the average current flowing through the primary winding and therefore the energy stored by the transformer 40 which in turn controls the power supplied to the power supply output 65 is kept within the regulated range. A compensation circuit 105 is coupled to the feedback pin 85 in order to lower the bandwidth of the frequency of operation of the pulse width modulator.

Inrush currents are minimized at start up by use of soft start capacitor 110. Soft start functionality is termed to be a functionality that reduces the inrush currents at start up. At this instant a current begins to flow through feedback resistor 80 and thereby into soft start capacitor 110. As the voltage of soft start capacitor 110 increases slowly, current will flow through light emitting diode 115 of optocoupler 70 thereby controlling the duty cycle of the switch. Once the voltage of the soft start capacitor 110 reaches the reverse breakdown voltage of zener diode 75 current will flow through zener diode 75. The approach described above will reduce the inrush currents into the power supply, however, it will be several cycles before the light emitting diode 115 will begin conducting. During the several cycles the maximum inrush current will still flow through the primary winding and other secondary side components. During these cycles the transformer may saturate, and therefore the transformer may have to be designed utilizing a higher core size than would be required for normal operation even with the use of soft start capacitor as in FIG. 1.

To reduce the EMI output by the power supply an EMI filter 120 is utilized. Additionally, pulse width modulated switch 90 is equipped with frequency oscillation terminals 125 and 130. Frequency oscillation terminal 125 and 130 receive a jitter current 135 that varies according to the ripple component of substantially DC voltage 25. The jitter current 135 is used to vary the frequency of the saw-toothed waveform generated by the oscillator contained in the pulse width modulated switch 90. The saw toothed waveform generated by the oscillator is compared to the feedback provided at the feedback pin 85. As the frequency of the saw toothed waveform varies, so will the switching frequency of the switch coupled between the drain and common terminal. This allows the switching frequency of the switch to be spread over a larger bandwidth, which minimizes the peak value of the EMI generated by the power supply at each frequency. By reducing the EMI the ability to comply with government standards is increased, because the government standards specify quasi-peak and average values at given frequency levels. Varying the frequency of operation of the pulse width modulated switch by varying the oscillation frequency of the oscillator is referred to as frequency jitter.

A problem associated with the EMI reduction scheme described with respect to FIG. 1 is that the ripple component will have variances due to variations in the line voltage and output load. Additionally, since the ripple may vary, design and the component value of EMI resistor 140 is difficult to determine and correspondingly design of the power supply becomes problematic.

SUMMARY OF THE INVENTION

In one embodiment the present invention comprises a pulse width modulated switch comprising a switch that allows a signal to be transmitted between a first terminal and a second terminal according to a drive signal. The pulse width modulated switch also comprises a frequency variation circuit that provides a frequency variation signal and an oscillator that provides an oscillation signal having a frequency that varies within a frequency range according to the frequency variation signal. The oscillator further provides a maximum duty cycle signal comprising a first state and a second state. The pulse width modulated circuit further comprises a drive circuit that provides the drive signal when the maximum duty cycle signal is in the first state and a magnitude of the oscillation signal is below a variable threshold level.

Another embodiment of the present invention comprises a pulse width modulated switch comprising a switch comprising a control input, the switch allowing a signal to be transmitted between a first terminal and a second terminal according to a drive signal. The pulse width modulated switch also comprises an oscillator that provides a maximum duty cycle signal comprising an on-state and an off-state, a drive circuit that provides the drive signal, and a soft start circuit that provides a signal instructing said drive circuit to disable the drive signal during at least a portion of said on-state of the maximum duty cycle.

In an alternate embodiment the present invention comprises a regulation circuit comprising a switch that allows a signal to be transmitted between a first terminal and a second terminal according to a drive signal, a drive circuit that provides the drive signal and a soft start circuit that provides a signal instructing the drive circuit to disable the drive signal.

In yet another embodiment the present invention comprises a regulation circuit comprising a switch that allows a signal to be transmitted between a first terminal and a second terminal according to a drive signal, a frequency variation circuit that provides a frequency variation signal, and a drive circuit that provides a drive signal for a maximum time period of a time duration cycle. The time duration of the cycle varies according to the frequency variation signal.

In the above referenced embodiments the pulse width modulated switch or regulation circuit may comprise a monolithic device.

An object of an aspect of the present invention is directed to a pulse width modulated switch that has integrated soft start capabilities.

Another object of an aspect of the present invention is directed toward a pulse width modulated switch that has integrated frequency variation capabilities.

Yet another object of an aspect of the present invention is directed toward a pulse width modulated switch that has integrated frequency variation capabilities and integrated soft start capabilities.

A further object of an aspect of the present invention is directed toward a low cost regulated power supply that has both soft start and frequency variation capabilities.

This and other objects and aspects of the present inventions are taught, depicted and described in the drawings and the description of the invention contained herein.

DESCRIPTION OF THE PREFERRED EMBODIMENT

Figure 2:
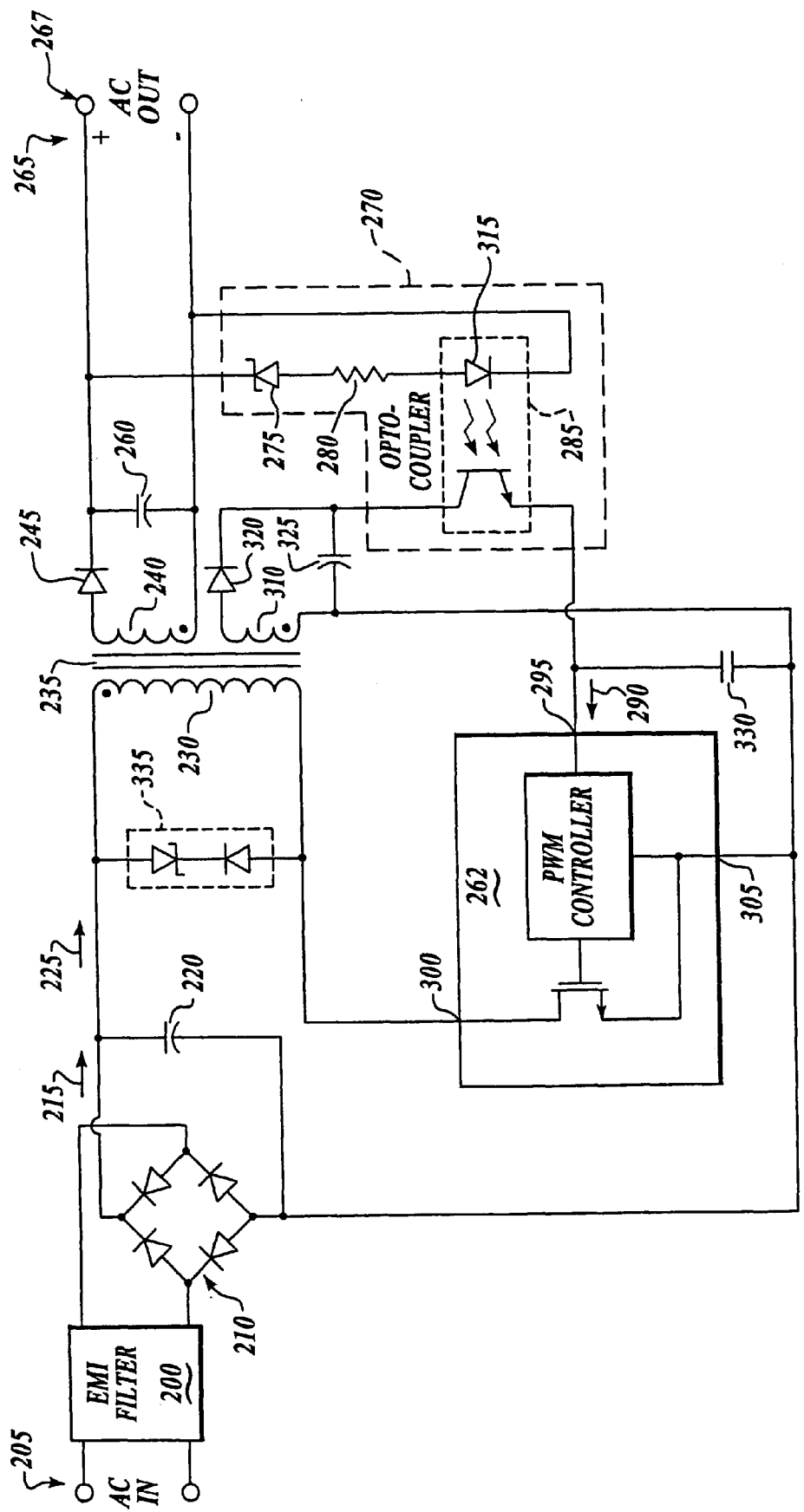
FIG. 2 is a presently preferred power supply utilizing an pulse width modulated switch according to the present invention.

Referring to FIG. 2, EMI filter 200 is coupled to an AC mains voltage 205. The AC mains voltage 205 is rectified by rectifier 210. The rectified voltage 215 is provided to power supply capacitor 220 which provides a substantially DC voltage 225. The substantially DC voltage 225 is provided to the primary winding 230 of transformer 235 which stores the energy provided to the primary winding 230. When the primary winding 230 is no longer receiving energy, energy is delivered by the transformer 235 to the secondary winding 240. The voltage induced across the secondary winding 240 is rectified by rectifier 245 and then transformed into secondary substantially DC voltage 265 by secondary capacitor 260 and provided to the power supply output 267.

Energy is no longer provided to the primary winding 230 when the pulse width modulated switch 262, which is coupled to the primary winding 230, ceases conduction. Pulse width modulated switch 262 is a switch that is controlled by a pulse width modulated signal. Pulse width modulated switch 262 conducts and ceases conduction according to a duty cycle, that is in part determined by feedback from the power supply output 267. Pulse width modulated switch 262 is a switch that operates according to pulse width modulated control. Feedback to the pulse width modulated switch 262 is accomplished by utilization of feedback circuit 270, which is presently preferred to comprise a zener diode 275 in series with a resistor 280 and optocoupler 285. Optocoupler 285 provides a feedback current 290 to feedback terminal 295 of pulse width modulated switch 262. The feedback current is utilized to vary the duty cycle of a switch coupled between the first terminal 300 and second terminal 305 and thus regulate the output voltage, current or power of the power supply.

Although, it is presently preferred that the output voltage is utilized for feedback, the present invention is also capable of utilizing either the current or power at the power supply output 267 without departing from the spirit and scope of the present invention.

A portion of the current supplied at the feedback terminal 295 is utilized to supply bias power for operation of the pulse width modulated switch 262. The remainder of the current input at the feedback terminal 295 is utilized to control the duty cycle of the pulse width modulated switch 262, with the duty cycle being inversely proportional to the feedback current.

A bias winding 310 is utilized to bias optocoupler 285 so that a feedback current can flow when light emitting diode 315 of optocoupler 285 conducts. The power supplied by the bias winding 310 is also used to charge pulse width modulation capacitor 330, the energy from which is utilized to power the pulse width modulated switch 262.

Overvoltage protection circuit 335 is utilized to prevent overvoltages from propagating through to the transformer 235.

Pulse width modulated switch 262 is supplied power during start up of the power supply by current flowing into the first terminal 300. An embodiment of one type of apparatus and method for designing a configuration for providing power to pulse width modulated switch through first terminal 300 is disclosed in commonly owned U.S. Pat. No. 5,014,178 which is incorporated herein by reference in its entirety.

The drain terminal 300, source terminal 305 and feedback terminal 295 are the electrical input and/or output points of the pulse width modulated switch 262. They need not be part of a monolithic device or integrated circuit, unless the pulse width modulated switch 262 is implemented utilizing a monolithic device or integrated circuit.

Pulse width modulated switch 262 also may have soft start capabilities. When the device to which the power supply is coupled is switched on, a power up signal is generated within the internal circuitry of pulse width modulated switch 262. The power up signal is used to trigger soft start circuitry that reduces the duty cycle of the switch that operates within the pulse width modulated switch 262 for a predetermined period of time, which is presently preferred to be ten (10) milliseconds. Once soft start operation is completed, pulse width modulated switch 262 operates according to its regular duty cycle.

Alternatively, or in addition to soft start functionality, pulse width modulated switch 262 may also have frequency jitter functionality. That is, the switching frequency of the pulse width modulated switch 262 varies according to an internal frequency variation signal. This has an advantage over the frequency jitter operation of FIG. 1 in that the frequency range of the presently preferred pulse width modulated switch 262 is known and fixed, and is not subject to the line voltage or load magnitude variations. At low powers, those less than approximately ten (10) watts, the common mode choke which is often utilized as part of the EMI filter 120 can be replaced with inductors or resistors.

Figure 1:
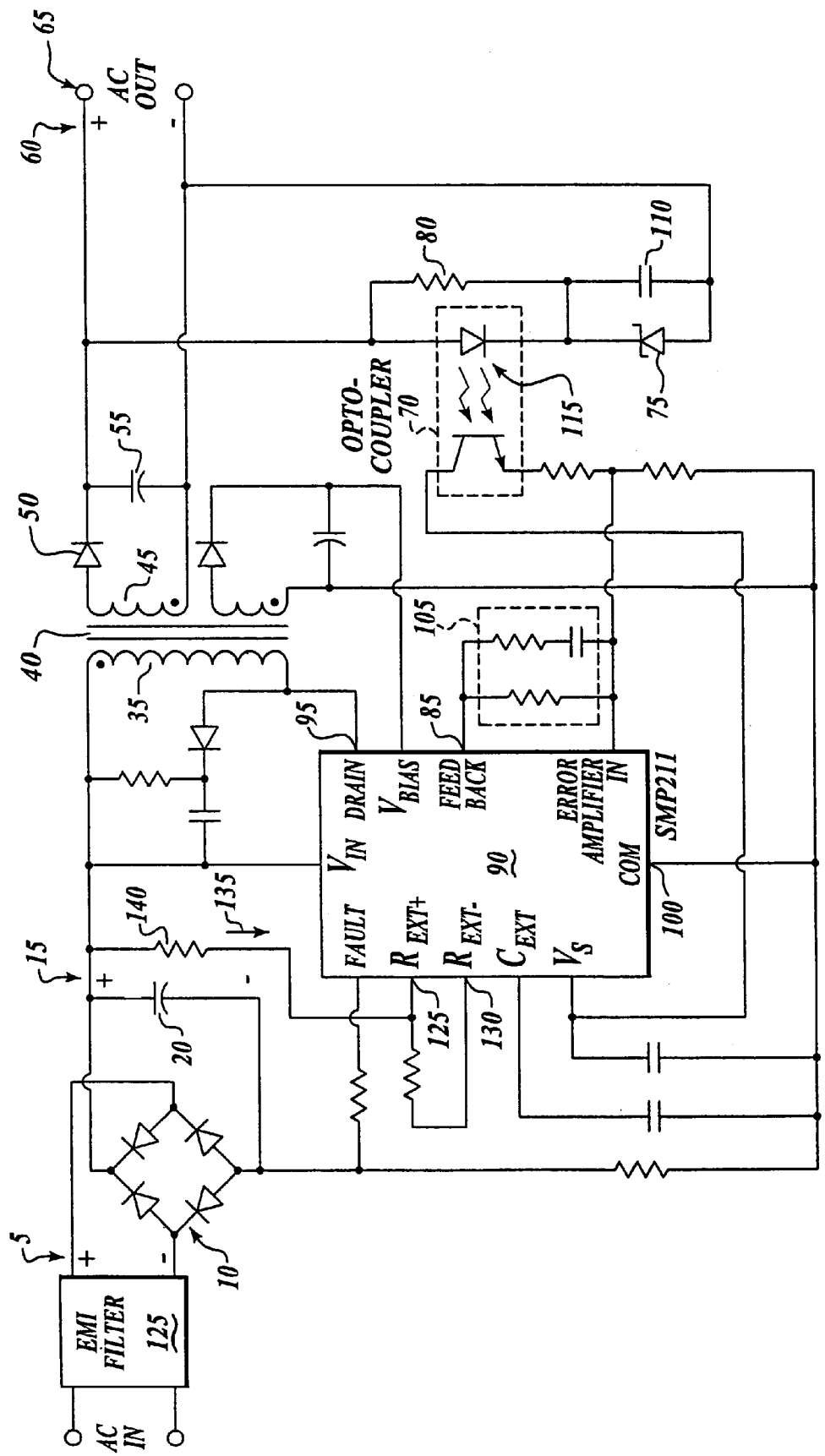
FIG. 1 is a known power supply utilizing a pulse width modulated switch, and external soft start, and frequency jitter functionality.

As can be seen when comparing the power supply of FIG. 1 to that of FIG. 2 the number of components utilized is reduced. This reduces the overall cost of the power supply as well as reducing its size.

Figure 3:
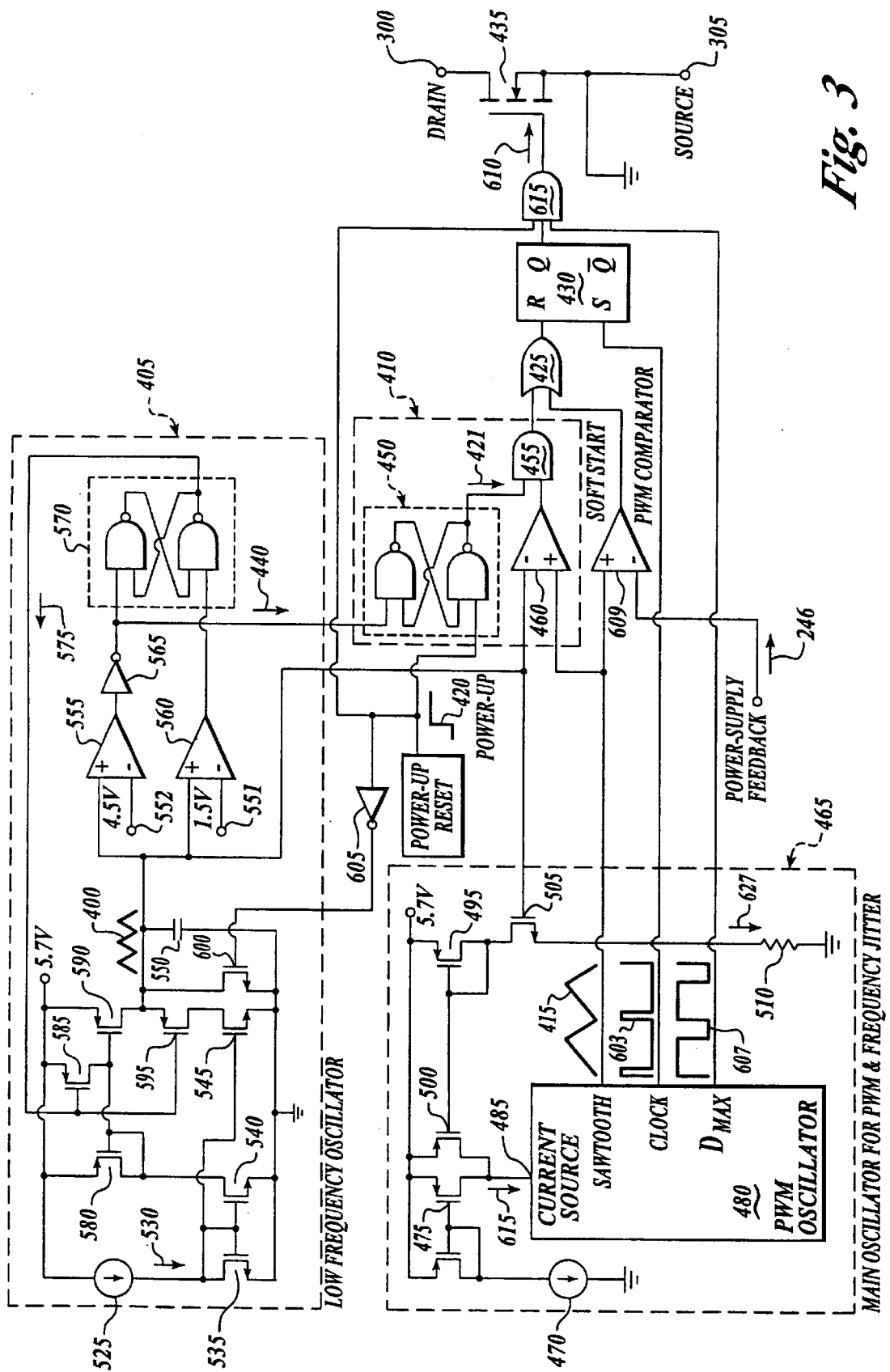
FIG. 3 is a presently preferred pulse width modulated switch according to the present invention.

Referring to FIG. 3, frequency variation signal 400 is utilized by the pulse. width modulated switch 262 to vary its switching frequency within a frequency range. The frequency variation signal 400 is provided by frequency variation circuit 405, which preferably comprises an oscillator that operates at a lower frequency than main oscillator 465. The frequency variation signal 400, is presently preferred to be a triangular waveform that preferrably oscillates between four point five (4.5) volts and one point five (1.5) volts. Although the presently preferred frequency variation signal 400 is a triangular waveform, alternate frequency variation signals such as ramp signals, counter output signals or other signals that vary in magnitude during a fixed period of time may be utilized as the frequency variation signal.

Figure 4:
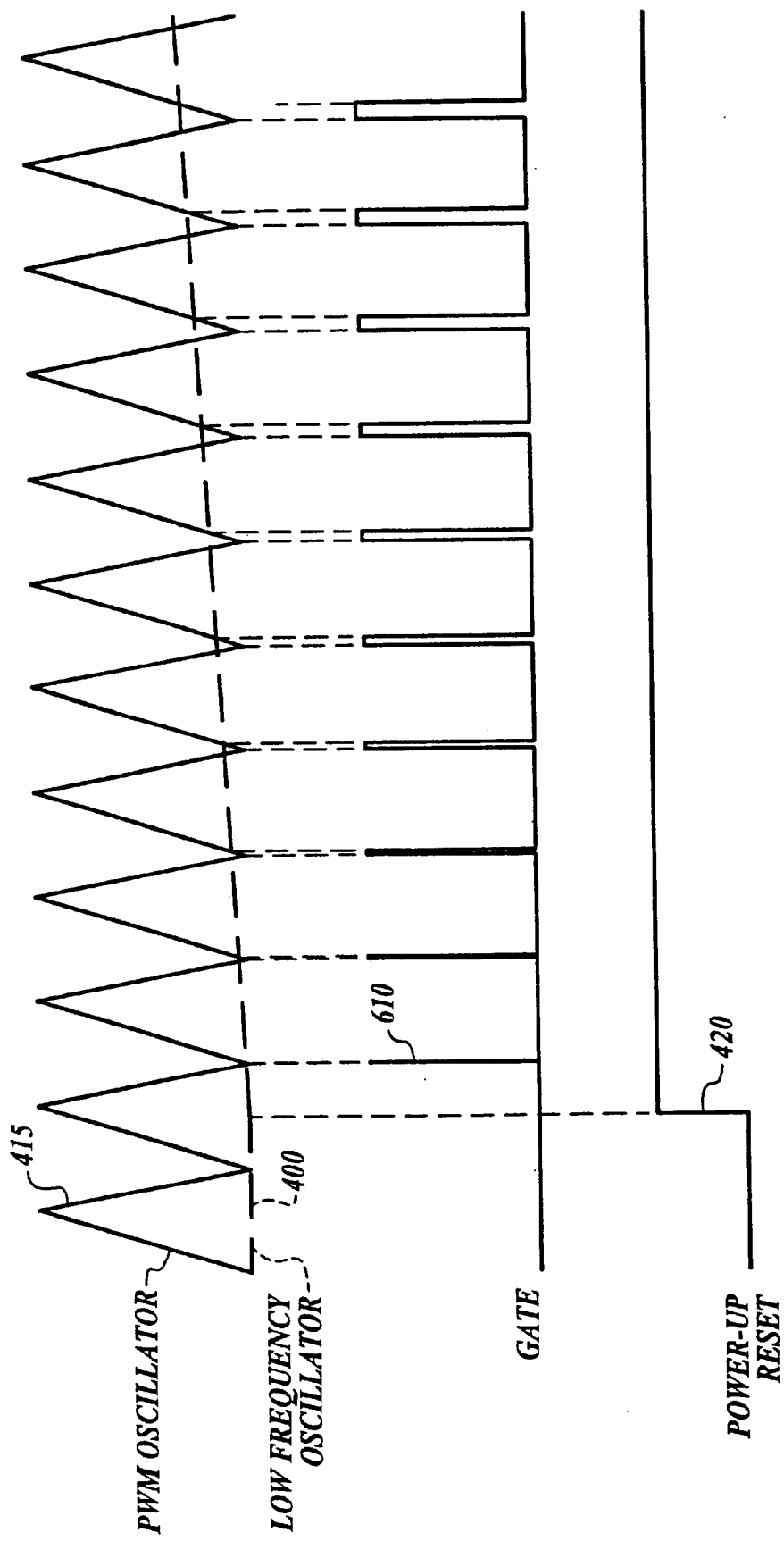
FIG. 4 is a timing diagram of the soft start operation of the presently preferred pulse width modulated switch according to the present invention.

The frequency variation signal 400 is provided to soft start circuit 410. During operation soft start circuit 410 is also provided with pulse width modulation frequency signal 415 and power up signal 420. Soft start enable signal 421 goes high at power up and remains high until oscillator signal 400 reaches its peak value for the first time. Soft start circuit 410 will provide a signal to or-gate 425 to reset latch 430 thereby deactivating conduction by the switch 435, which is presently preferred to be a MOSFET. Soft start circuit 410 will instruct switch 435 to cease conduction when the soft start enable signal 421 is provided and the magnitude of the frequency variation signal 400 is less than the magnitude of pulse width modulation signal 415. In other words, start up circuit 410 will allow the switch 435 to conduct as long as soft start enable signal is high and the magnitude of the pulse width modulation signal 415 is below the magnitude of frequency variation signal 400 as depicted in FIG. 4. In this way, the inrush current at startup will be limited for all cycles of operation, including the first cycle. By limiting the inrush current during all cycles of startup operation, the maximum current through each of the components of the power supply is reduced and the maximum current rating of each component can be decreased. The reduction in the ratings of the components reduces the cost of the power supply. Soft start signal 440 will no longer be provided by the frequency variation circuit 405 when the frequency variation signal 400 reaches its peak magnitude.

Operation of soft start circuit 410 will now be explained. Soft start circuit 410 comprises a soft start latch 450 that at its set input receives the power up signal 420 and its reset input receives the soft start signal 440. Soft start enable signal 421 is provided to one input of soft start and-gate 455 while the other input of soft start and-gate 455 is provided with an output from soft start comparator 460. The output of soft start comparator 460 will be high when the magnitude of frequency variation signal 400 is less than the magnitude of pulse width modulation oscillation signal 415.

The pulse width modulated switch 262 depicted in FIG. 3 also has frequency jitter functionality to help reduce the EMI generated by the power supply and pulse width modulated switch 262. Operation of the frequency jitter functionality will now be explained. Main oscillator 465 has a current source 470 that is mirrored by mirror current source 475. Main oscillator drive current 615 is provided to the current source input 485 of PWM oscillator 480. The magnitude of the current input into current source input 485 of PWM oscillator 480 determines the frequency of the pulse width modulation oscillation signal 415 which is provided by PWM oscillator 480. In order to vary the frequency of pulse width modulation oscillation signal 415, an additional current source 495 is provided within main oscillator 465. The additional current source 495 is mirrored by additional current source mirror 500. The current provided by additional current source 495 is varied as follows. Frequency variation signal 400 is provided to the gate of main oscillator transistor 505. As the magnitude of frequency variation signal 400 increases so does the voltage at the source of main oscillator transistor 505, due to the increasing voltage at the gate of main oscillation transistor and the relatively constant voltage drop between the gate and source of the main oscillation transistor 505. As the voltage at the source of main oscillation transistor 505 increases so does the current flowing through the main oscillation resistor 510. The current flowing through main oscillation resistor 510 is the same as the current flowing through additional current source 495 which is mirrored by additional current source mirror 500. Since, the presently preferred frequency variation signal 400 is a triangular waveform having a fixed period, the magnitude of the current input by additional current source mirror 500 will vary linearly with the magnitude of the rising and falling edges of the frequency variation signal 400. If the frequency variation signal 400 is a ramp signal, the frequency would linearly rise to a peak and then immediately fall to is lowest value. In this way, the current provided to current source input 485 of PWM oscillator 480 is varied in a known fixed range that allows for easy and accurate frequency spread of the high frequency current generated by the pulse width modulated switch. Further, the variance of the frequency is determined by the magnitude of the current provided by additional current source mirror 500, which is in turn a function of the resistance of main oscillation resistor 510.

Frequency variation circuit 405 includes a current source 525 that produces a fixed a magnitude current 530 that determines the magnitude of the frequency of the frequency variation signal 400. Although, the presently preferred current 530 has a fixed magnitude, the frequency variation signal can be generated utilizing a variable magnitude current, if a variable current is generated the frequency spread would not be fixed in time but would vary with the magnitude of current 530. The fixed magnitude current 530 is fed into first transistor 535, mirrored by second transistor 540 and fed into third transistor 545. The frequency variation signal 400 is generated by the charging and discharging of frequency variation circuit capacitor 550. Frequency variation circuit capacitor 550 is presently preferred to have a relatively low capacitance, which allows for integration into a monolithic chip in one embodiment of the pulse width modulated switch 262. The frequency variation signal 400 is provided to upper limit comparator 555 and lower limit comparator 560. The output of upper limit comparator 555 will be high when the magnitude of the frequency variation signal 400 exceeds the upper threshold voltage 552 which is presently preferred to be four point five (4.5) volts. The output of lower limit comparator 560 will be high when the magnitude of frequency variation signal 400 exceeds lower threshold voltage 557 which is presently preferred to be one point five volts (1.5) volts. The output of upper limit comparator 555 is provided to the frequency variation circuit inverter 565 the output of which is provided to the reset input of frequency variation circuit latch 570. The set input of frequency variation circuit latch 570 receives the output of lower limit comparator 560. In operation, the output of lower limit comparator 560 will be maintained high for the majority of each cycle of frequency variation signal 400 because the magnitude of frequency variation signal will be maintained between upper threshold 552, 4.5 volts, and the lower threshold 557, 1.5 volts. The output of upper limit comparator 555 will be low until the magnitude of frequency variation signal 400 exceeds upper level threshold 552. This means that the reset input will receive a high signal until the magnitude of the frequency variation signal 400 rises above the upper threshold signal 552.

The charge signal 575 output by frequency variation circuit latch 570 will be high until the frequency variation signal 400 exceeds the upper threshold limit signal 552. When the charge signal 575 is high, transistors 585 and 595 are turned off. By turning off transistors 585 and 595 current can flow into frequency variation circuit capacitor 550, which steadily charges frequency variation circuit capacitor 550 and increases the magnitude of frequency variation signal 400. The current that flows into frequency variation circuit capacitor 550 is derived from current source 525 because the current through transistor 590 is mirrored from transistor 580, which is mirrored from transistor 535.

During power up, when power-up signal 420 is low, the output of inverter 605 is high which turns on transistor 600 causing frequency variation signal 400 to go low. The frequency variation signal 400 is presently preferred to start from its lowest level to perform the soft start function during its first cycle of operation.

Steady-state operation of the pulse width modulated switch 262, i.e. non start up operation, will now be described. PWM oscillator 480 provides pulse width modulation oscillation signal 415 to pulse width modulation comparator 609, the output of which will be high when the magnitude of pulse width modulation signal 415 is greater than the magnitude of a feedback signal 296 which is a function of the input provided at feedback terminal 295. When the output of pulse width modulation comparator 609 is high or-gate 425 is triggered to go high, which in turn resets pulse width modulation latch 430, removing the on signal from the control input switch 435, thereby turning off switch 435. Pulse width modulation latch 430 is set by clock signal 603, which is provided at the beginning of each cycle of pulse width modulation oscillator 480. Drive circuit 615, which is presently preferred to be an and-gate, receives the output of pulse width modulation latch 430, power up signal 420, and maximum duty cycle signal 607. As long as each one of the signals is high, drive signal 610 is provided to the gate of MOSFET 435, which is coupled between first terminal 300 and second terminal 305 of the pulse width modulated switch 262. When any of the output of pulse width modulation latch 430, power up signal 420, or maximum duty cycle signal 607 goes low drive signal 610 is no longer provided and switch 435 ceases conduction.

Referring to FIG. 4, frequency variation signal 400 preferably has a period, which is greater than that of pulse width modulated oscillation signal 415. The presently preferred period for frequency variation signal 400 is twenty (20) milliseconds, in order to allow for a smooth start up period which is sufficiently longer than the period of pulse width modulated signal 415 which is presently preferred to be ten (10) microseconds. Drive signal 610 will be provided only when the magnitude of pulse width modulated signal 415 is less than the magnitude of frequency variation signal 400. Further, frequency variation signal 400 will be preferably initiated starting from low voltage when power up signal 420 is provided.

Figure 5:
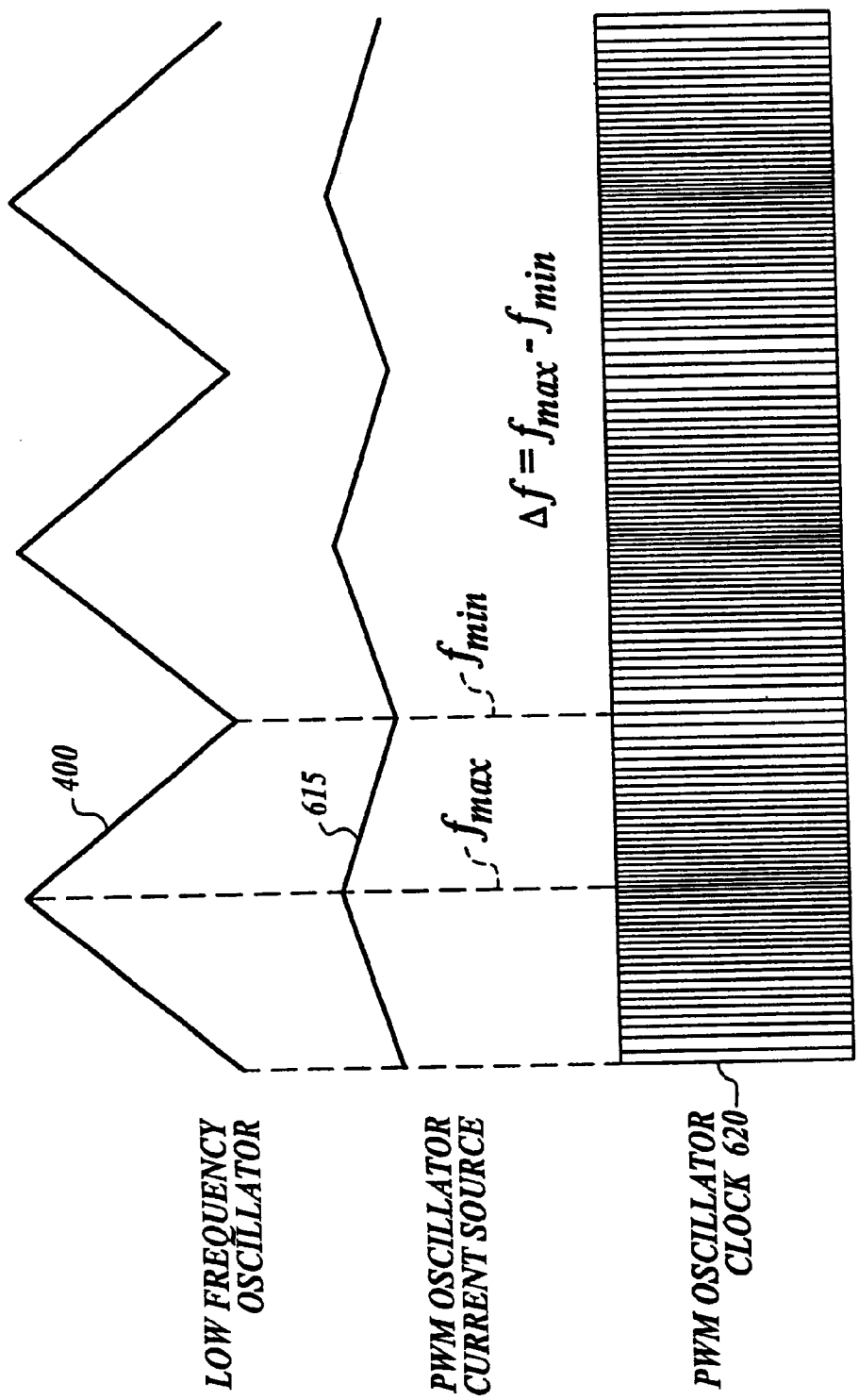
FIG. 5 is a timing diagram of the frequency jitter operation of the presently preferred pulse width modulated switch according to the present invention.

Referring to FIG. 5, frequency variation signal 400 which is presently preferred to have a constant period is provided to the main oscillator 465. The magnitude of the pulse width modulator current 615 will approximately be the magnitude of frequency variation signal 400 divided by the resistance of resistor 510 plus the magnitude of the current produced by current source 470. In this way the pulse width modulator current 615 will vary with the magnitude of the frequency variation signal 400. The result is that the frequency of pulse width modulation signal is varied according to the magnitude of this current. It is presently preferred that the pulse width modulator current source produces a constant current having a magnitude of twelve point one (12.1) microamperes, and that frequency variation signal induced current 627 varies between zero (0) and eight hundred (800) nanoamperes. Thereby spreading the frequency of operation of the pulse width modulation oscillator 480 and reducing the average magnitude and the quasi-peak magnitude at all frequency levels of the EMI generated by the power supply.

Figure 6:
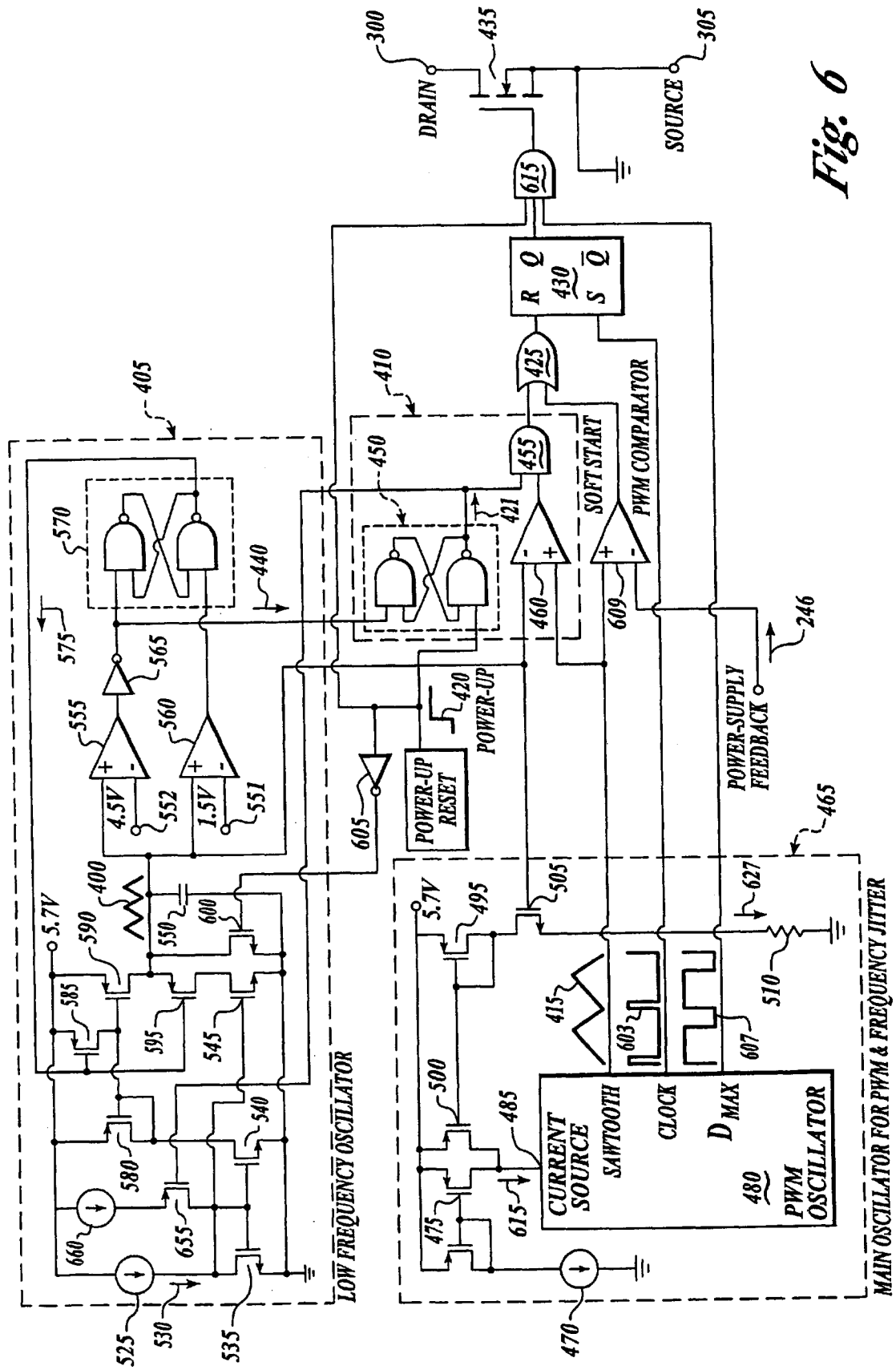
FIG. 6 is an alternate presently preferred pulse width modulated switch according to the present invention.

Referring to FIG. 6, an alternate presently preferred pulse width modulated switch 262 includes all of the same components as described with respect to FIG. 3. In addition to these components, a second frequency variation circuit current source 660 and transistor 655 are added to the frequency variation circuit 405. Transistor 655 is activated only when the output of soft start latch 450 goes low. When transistor 655 is activated the current provided to the frequency variation circuit 405 increases as does the frequency of frequency variation signal 400. However, transistor 655 will only be turned on when the output of soft start latch 450 goes low, i.e. when the magnitude of frequency variation signal 400 first reaches the upper threshold after power up. The period of frequency variation signal 400 will then increase after its first half cycle. This will decreases the period of the cycle during which the frequency is spread, without decreasing the frequency range. The benefit of the decreased cycle period will further decrease the quasi-peak levels of the EMI due to spending less time at each frequency level.

Figure 7:
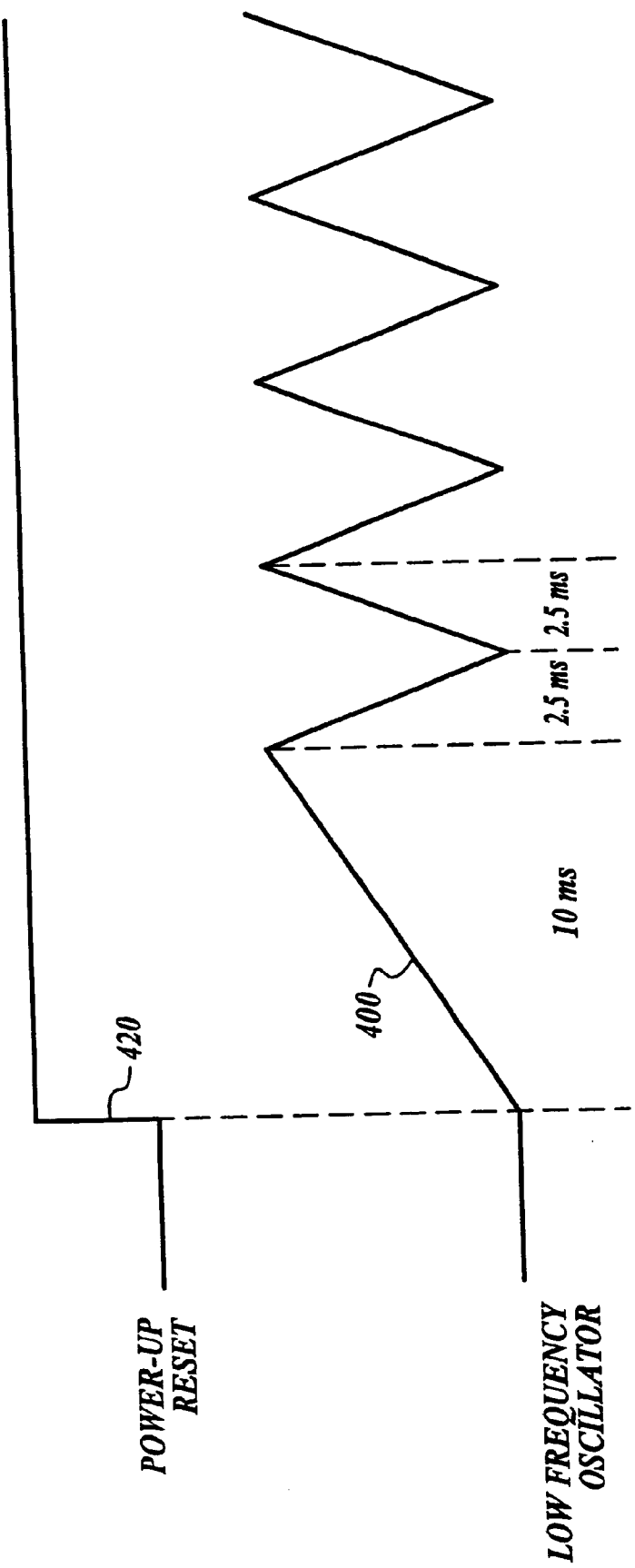
FIG. 7 is a timing diagram of the operation of the alternate presently preferred pulse width modulated switch of FIG. 6 according to the present invention.

Referring to FIG. 7, operation of the frequency variation circuit 405 of FIG. 6 is depicted. Frequency variation signal 405 will preferably have a period of ten (10) milliseconds for its first half cycle. After that, when the transistor 655 is turned on the period is preferably decreased to five (5) milliseconds. Pulse width modulated switch 262 is presently preferred to be a monolithic device.

Figure 8:
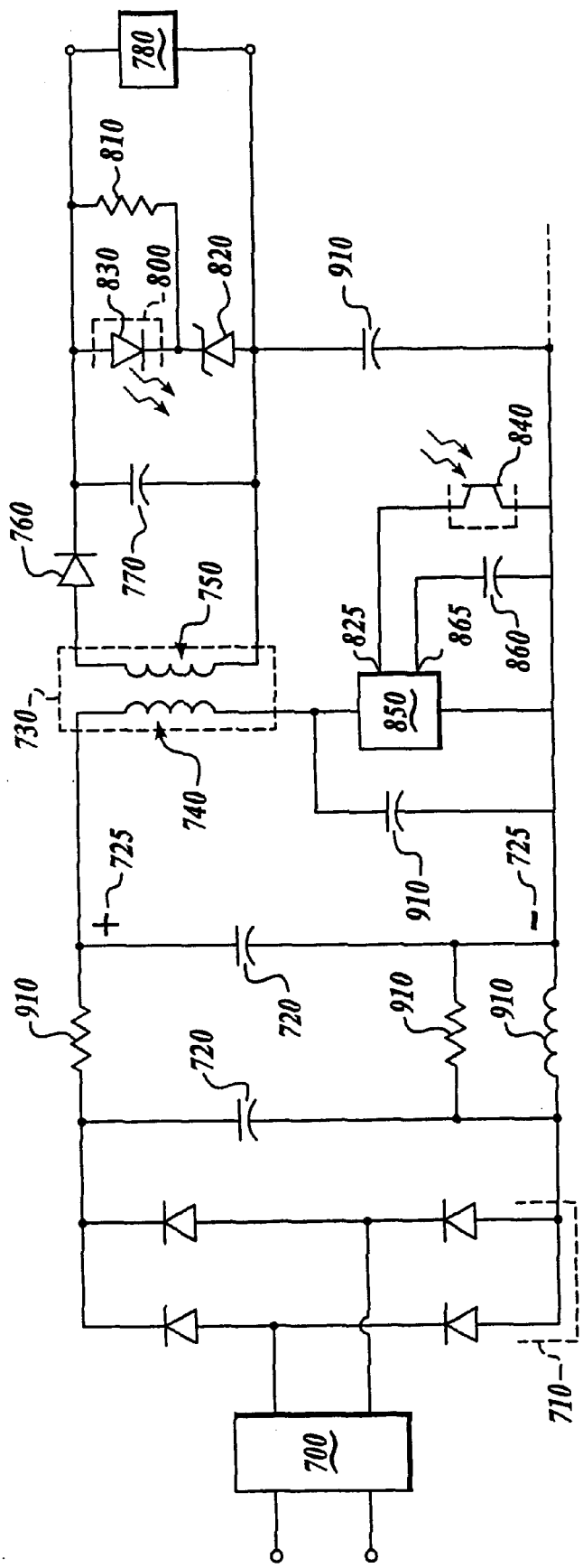
FIG. 8 is a presently preferred power supply utilizing a regulation circuit according to the present invention.

Referring to FIG. 8, a power supply comprises a bridge rectifier 710 that rectifies an input AC mains voltage. Power supply capacitors 720 charge with the rectified AC mains voltage to maintain an input DC voltage 725. A presently preferred range for input DC voltage 725 is approximately one hundred (100) to four hundred (400) volts to allow for operation based upon worldwide AC mains voltages which range between eighty five (85) and two hundred sixty five (265) volts. The presently preferred power supply also includes harmonic filter components 910 which in combination with capacitors 720 reduce the harmonic current injected back into the power grid. Transformer 730 includes a primary winding 740 magnetically coupled to secondary winding 750. The secondary winding 750 is coupled to a diode 760 that is designed to prevent current flow in the secondary winding 750 when the regulation circuit 850 is conducting (on-state). A capacitor 770 is coupled to the diode 760 in order to maintain a continuous voltage on a load 780 which has a feedback circuit coupled to it. A presently preferred feedback circuit comprises an optocoupler 800 and zener diode 820. The output of optocoupler 800 is coupled to the feedback terminal 825 of regulation circuit 850. The presently preferred regulation circuit 850 switches on and off at a duty cycle that is constant at a given input DC voltage 740. A regulation circuit power supply bypass capacitor 860 is coupled to and supplies power to regulation circuit 850 when the regulation circuit 850 is in the on-state.

Operation of the power supply will now be described. An AC mains voltage is input through EMI filter 700 into bridge rectifier 710 which provides a rectified signal to power supply capacitors 720 that provide input DC voltage 725 to primary winding 740. Regulation circuit 850, which preferably operates at a constant frequency and about constant duty cycle at a given input DC voltage 725, allows current to flow through primary winding 740 during its on state of each switching cycle and acts as open circuit in its off state. When current flows through primary winding 740 transformer 730 is storing energy, when no current is flowing through primary winding 740 any energy stored in transformer 730 is delivered to secondary winding 750. Secondary winding 750 then provides the energy to capacitor 770. Capacitor 770 delivers power to the load 780. The voltage across the load 780 will vary depending on the amount of energy stored in the transformer 730 in each switching cycle which is in turn dependent on the length of time current is flowing through primary winding 740 in each switching cycle which is presently preferred to be constant at a given input DC voltage 725. The presently preferred regulation circuit 850 allows the voltage delivered to the load to be maintained at a constant level.

It is presently preferred that the sum of the voltage drop across optocoupler 800 and the reverse break down voltage of zener diode 820 is approximately equal to the desired threshold level. When the voltage across the load 780 reaches the threshold level, current begins to flow through the optocoupler 800 and zener diode 820 that in turn is used to disable the regulation circuit 850. Whenever regulation circuit 850 is in the off-state the regulation circuit power supply bypass capacitor 860 is charged to the operating supply voltage, which is presently preferred to be five point seven (5.7) volts by allowing a small current to flow from bypass terminal 865 to the regulation circuit power supply bypass capacitor 860. Regulation circuit power supply bypass capacitor 860 is used to supply power to operate regulation circuit 850 when it is in the on-state.

When the regulation circuit 850 is disabled, an open circuit condition is created in primary winding 740 and transformer 730 does not store energy. The energy stored in the transformer 730 from the last cycle of regulation circuit 850 is then delivered to secondary winding 750 which in turn supplies power to the load 780. Once the remaining energy in transformer 750 is delivered to the load 780 the voltage of the load 780 will decrease. When the voltage at the load 780 decreases below the threshold level, current ceases to flow through optocoupler 800 and regulation circuit 850 resumes operation either instantaneously or nearly instantaneously.

The presently preferred regulation circuit 850 has a current limit feature. The current limit turns off the regulation circuit 850, when the current flowing through the regulation circuit 850 rises above a current threshold level. In this way regulation circuit 850 can react quickly to changes such as AC ripple that occur in the rectified AC mains voltage, and prevents the propagation of the voltage changes to the load. The current limit increases the responsiveness of the regulation circuit to input voltage changes and delivers constant power output independent for the AC mains input voltage.

Although the presently preferred power supply of FIG. 8 utilizes current mode regulation and a feedback circuit that includes an optocoupler and zener diode, the present invention is not to be construed as to be limited to such a feedback method or circuit. Either current or voltage mode regulation may be utilized by the present invention without departing from the spirit and scope of the present invention so long as a signal indicative of the power supplied to the load is supplied to the feedback terminal 825 of the regulation circuit 850. Additionally, although the presently preferred power supplies both utilize an optocoupler and zener diode as part of feedback circuits other feedback circuits may be utilized by the present invention without departing from the spirit and scope of the present invention.

Regulation circuit 850 also may have integrated soft start capabilities. When the device to which the power supply is coupled is switched on, a power up signal is generated within the internal circuitry of regulation circuit 850. A power up signal is used to trigger soft start circuitry that reduces the duty cycle of the switch that operates within the pulse width modulated switch 262 for a predetermined period of time, which is presently preferred to be ten (10) milliseconds. Once soft start operation is completed, regulation circuit 850 operates according to its regular duty cycle.

Alternatively, or in addition to soft start functionality, regulation circuit 850 may also have frequency jitter functionality. That is, the switching frequency of the regulation circuit 850 varies according to an internal frequency variation signal. This has an advantage over the frequency jitter operation of FIG. 1 in that the frequency range of the presently regulation circuit 850 is known and fixed, and is not subject to the line voltage or load magnitude variations.

Figure 9:
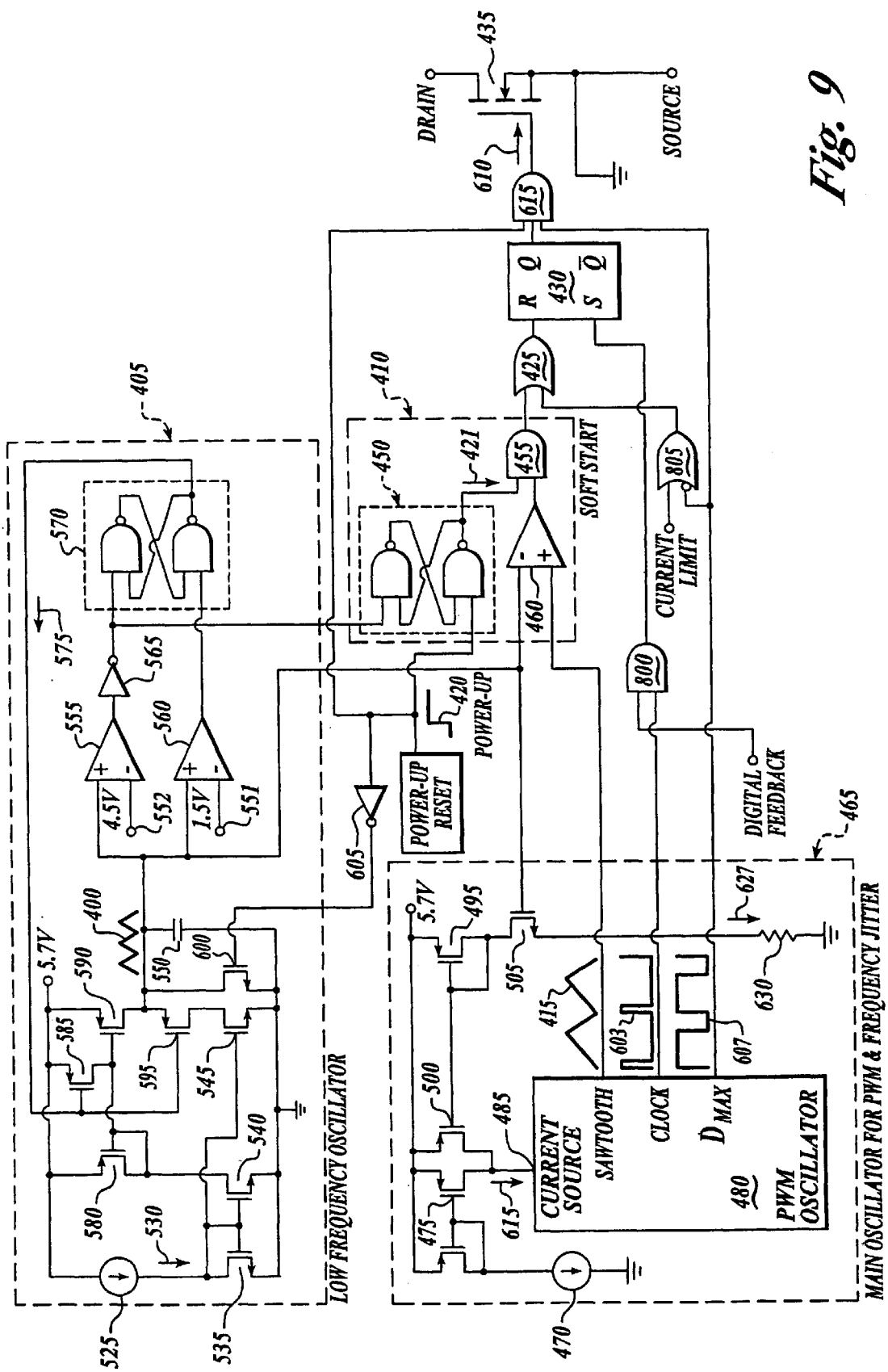
FIG. 9 is a presently preferred regulation circuit according to the present invention.

Referring to FIG. 9, frequency variation circuit 405 and main oscillator 465 function as described with respect to FIG. 3. In operation it is the variance of the high and low states of maximum duty cycle signal 607 that generates the frequency jitter functionality of the regulation circuit 850. A presently preferred regulation circuit 850 and its steady-state operation is depicted and described in copending patent application Ser. No. 09/032,520 which is hereby incorporated by reference in its entirety.

The regulation circuit of FIG. 9 can be modified to include a second current source to further increase the period of main oscillation signal 415 which achieves the same result and function as described with respect of FIGS. 6 and 7.

The soft start functionality of the presently preferred regulation circuit 850 of FIG. 9, will shorten the on-time of switch 435 to less than the time of the maximum duty cycle signal 607 as long as the soft start enable signal 421 is provided and the magnitude of frequency variation signal 400 is less than the magnitude of main oscillation signal 415.

The presently preferred regulation circuit 850 preferably comprises a monolithic device.

While the embodiments, applications and advantages of the present invention have been depicted and described, there are many more embodiments, applications and advantages possible without deviating from the spirit of the inventive concepts described herein. Thus, the inventions are not to be restricted to the preferred embodiments, specification or drawings. The protection to be afforded this patent should therefore only be restricted in accordance with the spirit and intended scope of the following claims.

What is claimed is:

1. A pulse width modulated switch comprising
   a first terminal;
   a second terminal;
   a switch comprising a control input, the switch allowing a signal to be transmitted between said first terminal and said second terminal according to a drive signal provided at said control input;
   an oscillator that provides a maximum duty cycle signal comprising an on-state and an off-state;
   a drive circuit that provides said drive signal according to said maximum duty cycle signal; and
   a soft start circuit that provides a signal instructing said drive circuit to disable said drive signal during at least a portion of said on-state of said maximum duty cycle.

2. The pulse width modulated switch of claim 1 wherein said a first terminal, said second terminal, said switch, said oscillator, said drive circuit and said soft start circuit comprise a monolithic device.

3. The pulse width modulated switch of claim 1 further comprising an additional oscillator that provides a soft start signal to said soft start circuit, and wherein when said soft start signal is removed said soft start circuit ceasing operation.

4. The pulse width modulated circuit of claim 3 wherein said additional oscillator further comprises
   a comparator that provides a comparator signal when a magnitude of a reference signal is greater than or equal to a magnitude of said frequency variation oscillation signal, and
   an inverter that receives said comparator signal and provides said soft start signal.

5. The pulse width modulated switch of claim 1 further comprising a frequency variation circuit that provides a frequency variation signal, wherein said oscillator provides an oscillation signal and wherein said soft start circuit provides said signal instructing said drive circuit to disable said drive signal when a magnitude of said oscillation signal is greater than a magnitude of said frequency variation signal.

6. The pulse width modulated switch of claim 5 wherein said oscillator comprises an input that receives said frequency signal and said oscillation signal comprises a frequency range, and wherein said frequency of said oscillation signal varies within said frequency range according to a magnitude of said frequency variation signal.

7. The pulse width modulated switch of claim 6 wherein said oscillator further comprises a current source, wherein said frequency of said oscillation signal is a function of a sum of a magnitude of a current provided by said current source and said magnitude of said frequency variation signal.

8. The pulse width modulated switch of claim 1 further comprising
- a rectifier comprising a rectifier input and a rectifier output, said rectifier input receiving an AC mains signal and said rectifier output providing a rectifier signal;
- a power supply capacitor that receives said rectified signal;
- a first winding comprising a first terminal and a second terminal, said first winding receiving a substantially DC signal from said power supply capacitor, said second terminal of said first winding coupled to said first terminal of said pulse width modulated switch; and
- a second winding magnetically coupled to said first winding, said first winding capable of being coupled to a load.

9. A regulation circuit comprising
- a first terminal;
- a second terminal;
- a switch comprising a control input, said switch allowing a signal to be transmitted between said first terminal and said second terminal according to a drive signal provided at said control input;
- a drive circuit that provides said drive signal for a maximum time period of a cycle; and
- a soft start circuit that provides a signal instructing said drive circuit to disable said drive signal during at least a portion of said maximum time period.

10. The regulation circuit of claim 9 further comprising an oscillator that provides a maximum duty cycle signal to said drive circuit, said maximum duty cycle signal comprising an on-state for said maximum time period.

11. The regulation circuit of claim 10 further comprising a frequency variation circuit that provides a frequency variation signal, wherein said oscillator provides an oscillation signal and wherein said soft start circuit provides said signal instructing said drive circuit to disable said drive signal when a magnitude of said oscillation signal is greater than a magnitude of said frequency variation signal.

12. The regulation circuit of claim 9 further comprising an additional oscillator that provides a soft start signal to said soft start circuit, and wherein when said soft start signal is removed said soft start circuit ceasing operation.

13. The regulation circuit of claim 12 wherein said additional oscillator further comprises
- a comparator that provides a comparator signal when a magnitude of a reference signal is greater than or equal to a magnitude of said additional oscillation signal, and
- an inverter that receives said comparator signal and provides said soft start signal.

14. The regulation circuit of claim 9 further comprising a frequency variation circuit that provides a frequency variation signal and wherein said maximum time period varies according to a magnitude of said frequency variation signal.

15. The regulation circuit of claim 9 further comprising a feedback terminal and wherein when a signal is received at said feedback terminal said drive signal is discontinued for at least one cycle.

16. The regulation circuit of claim 9 wherein said first terminal, said second terminal, said oscillator and said soft start circuit comprise a monolithic device.

17. The regulation circuit of claim 16 further comprising a current limit circuit that provides a signal instructing said drive circuit to discontinue said drive signal when a current received at said first terminal of said regulation circuit is above a threshold level.

18. The regulation circuit of claim 9 further comprising
- a rectifier comprising a rectifier input and a rectifier output, said rectifier input receiving an AC mains signal and said rectifier output providing a rectifier signal;
- a power supply capacitor that receives said rectified signal;
- a first winding comprising a first terminal and a second terminal, said first winding receiving a substantially DC signal from said power supply capacitor, said second terminal of said first winding coupled to said first terminal of said regulation circuit; and
- a second winding magnetically coupled to said first winding, said first winding capable of being coupled to a load.

* * * * *

UNITED STATES PATENT AND TRADEMARK OFFICE
CERTIFICATE OF CORRECTION

PATENT NO. : 6,229,366 B1  Page 1 of 1
DATED : May 8, 2001
INVENTOR(S) : Balakirshnan et al.

It is certified that error appears in the above-identified patent and that said Letters Patent is hereby corrected as shown below:

Title page,
Item [75], Inventors, replace inventor name "Balu Balakirshnan" and insert -- Balu Balakrishnan --.

Signed and Sealed this

Eighth Day of January, 2002

Attest:

JAMES E. ROGAN
Attesting Officer  Director of the United States Patent and Trademark Office

UNITED STATES PATENT AND TRADEMARK OFFICE
CERTIFICATE OF CORRECTION

PATENT NO. : 6,229,366 C1
APPLICATION NO. : 90/008327
DATED : December 20, 2011
INVENTOR(S) : Balu Balakrishnan, Alex Djenguerian and Leif Lund It is certified that error appears in the above-identified patent and that said Letters Patent is hereby corrected as shown below:

In the Ex Parte Reexamination Certificate (8768th), Title Page, Item (12), please replace inventor name "Balak*ir*shnan" and insert -- Balak*ri*shnan --.

In the Ex Parte Reexamination Certificate (8768th), Title Page, Item (54), please replace the word "INT*ER*GRATED" and insert -- INT*E*GRATED --.

In the Ex Parte Reexamination Certificate (8768th), Title Page, Item (75), Inventors, please replace inventor name "Balu Balak*ir*shnan" and insert -- Balu Balak*ri*shnan --.

In the Ex Parte Reexamination Certificate (8768th), Title Page, Item (73), Assignee, please replace "Power Integrations Inc." and insert -- Power Integrations, Inc. --.

In the Ex Parte Reexamination Certificate (8768th), page 2, column 2, claim 21, 5th paragraph, line 1, please replace the word "mean" and insert -- mean*s* --.

Signed and Sealed this
Fourteenth Day of February, 2012

David J. Kappos
*Director of the United States Patent and Trademark Office*

EX PARTE REEXAMINATION CERTIFICATE (8768th)
United States Patent
Balakirshnan et al.

(10) Number: US 6,229,366 C1
(45) Certificate Issued: Dec. 20, 2011

(54) OFF-LINE CONVERTER WITH INTERGRATED SOFTSTART AND FREQUENCY JITTER

(75) Inventors: Balu Balakirshnan, Saratoga, CA (US); Alex Djenguerian, Saratoga, CA (US); Leif Lund, San Jose, CA (US)

(73) Assignee: Power Integrations Inc., Sunnyvale, CA (US)

Reexamination Request:
No. 90/008,327, Nov. 9, 2006

Reexamination Certificate for:
Patent No.: 6,229,366
Issued: May 8, 2001
Appl. No.: 09/573,081
Filed: May 16, 2000

Certificate of Correction issued Jan. 8, 2002.

Related U.S. Application Data

(62) Division of application No. 09/080,774, filed on May 18, 1998, now Pat. No. 6,107,851.

(51) Int. Cl.
*H03K 3/00* (2006.01)
*H03K 3/0231* (2006.01)
*H03K 7/00* (2006.01)
*H03K 7/08* (2006.01)

(52) U.S. Cl. .................. 327/172; 327/143; 327/531; 327/544

(58) Field of Classification Search ............... 363/21.11, 363/49
See application file for complete search history.

(56) References Cited

To view the complete listing of prior art documents cited during the proceeding for Reexamination Control Number 90/008,327, please refer to the USPTO's public Patent Application Information Retrieval (PAIR) system under the Display References tab.

*Primary Examiner* — Christopher E Lee

(57) ABSTRACT

A pulse width modulated switch comprises a first terminal, a second terminal, and a switch that allows a signal to be transmitted between the first terminal and the second terminal according to a drive signal provided at a control input. The pulse width modulated switch also comprises a frequency variation circuit that provides a frequency variation signal and an oscillator that provides an oscillation signal having a frequency of that varies within a frequency range according to the frequency variation signal. The oscillator further provides a maximum duty cycle signal comprising a first state and a second state. The pulse width modulated switch further comprises a drive circuit that provides the drive signal when the maximum duty cycle signal is in the first state and a magnitude of the oscillation signal is below a variable threshold level.

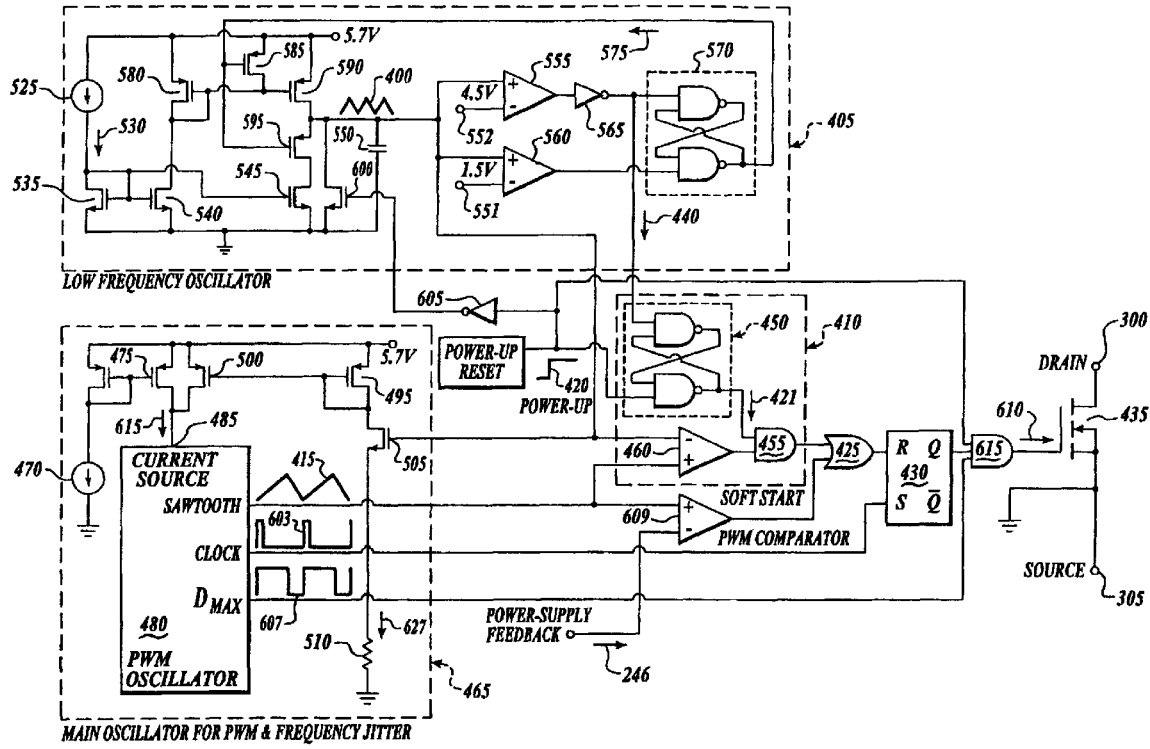

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 8 and 18 are cancelled.

Claims 1, 2, 9 and 16 are determined to be patentable as amended.

Claims 10 and 14, dependent on an amended claim, are determined to be patentable.

New claims 19-23 are added and determined to be patentable.

Claims 3-7, 11-13, 15 and 17 were not reexamined.

1. A pulse width modulated switch comprising
a first terminal;
a second terminal;
a switch comprising a control input, the switch allowing a signal to be transmitted between said first terminal and said second terminal according to a drive signal provided at said control input;
an oscillator that provides a maximum duty cycle signal comprising an on-state and an off-state;
a drive circuit that provides said drive signal according to said maximum duty cycle signal; and
a soft start circuit [that provides] *means for providing* a signal instructing said drive circuit to disable said drive signal during at least a portion of said on-state of said maximum duty cycle.

2. The pulse width modulated switch of claim 1 wherein said a first terminal, said second terminal, said switch, said oscillator, said drive circuit and said soft start circuit *means* comprise a monolithic device.

9. A regulation circuit comprising
a first terminal;
a second terminal;
a switch comprising a control input, said switch allowing a signal to be transmitted between said first terminal and said second terminal according to a drive signal provided at said control input;
a drive circuit that provides said drive signal for a maximum time period of a cycle; and
a soft start circuit [that provides] *means for providing* a signal instructing said drive circuit to disable said drive signal during at least a portion of said maximum time period.

16. The regulation circuit of claim 9 wherein said first terminal, said second terminal, said oscillator and said soft start circuit *means* comprise a monolithic device.

*19. A pulse width modulated switch, comprising:*
*a first terminal;*
*a second terminal;*
*a switch comprising a control input, the switch allowing a signal to be transmitted between said first terminal and said second terminal according to a drive signal provided at said control input;*
*an oscillator that provides a maximum duty cycle signal comprising an on-state and an off-state;*
*a drive circuit that provides said drive signal according to said maximum duty cycle signal;*
*a soft start circuit that provides a signal instructing said drive circuit to disable said drive signal during at least a portion of said on-state of said maximum duty cycle; and*
*a frequency variation circuit that provides a frequency variation signal, wherein said oscillator provides an oscillation signal and wherein said soft start circuit provides said signal instructing said drive circuit to disable said drive signal when a magnitude of said oscillation signal is greater than a magnitude of said frequency variation signal.*

*20. A regulation circuit, comprising:*
*a first terminal;*
*a second terminal;*
*a switch comprising a control input, said switch allowing a signal to be transmitted between said first terminal and said second terminal according to a drive signal provided at said control input;*
*a drive circuit that provides said drive signal for a maximum time period of a cycle;*
*a soft start circuit that provides a signal instructing said drive circuit to disable said drive signal during at least a portion of said maximum time period;*
*an oscillator that provides a maximum duty cycle signal to said drive circuit, said maximum duty cycle signal comprising an on-state for said maximum time period; and*
*a frequency variation circuit that provides a frequency variation signal, wherein said oscillator provides an oscillation signal and wherein said soft start circuit provides said signal instructing said drive circuit to disable said drive signal when a magnitude of said oscillation signal is greater than a magnitude of said frequency variation signal.*

*21. A regulation circuit, comprising:*
*a first terminal;*
*a second terminal;*
*a switch comprising a control input, said switch allowing a signal to be transmitted between said first terminal and said second terminal according to a drive signal provided at said control input;*
*a drive circuit that provides said drive signal for a maximum time period of a cycle;*
*a soft start circuit mean for providing a signal instructing said drive circuit to disable said drive signal during at least a portion of said maximum time period; and*
*a frequency variation circuit that provides a frequency variation signal and wherein said maximum time period varies according to a magnitude of said frequency variation signal, wherein the frequency variation signal is an internally controlled signal within the regulation circuit.*

22. A power supply, comprising:

a pulse width modulated switch comprising:

a first terminal;

a second terminal;

a switch comprising a control input, the switch allowing a signal to be transmitted between said first terminal and said second terminal according to a drive signal provided at said control input;

an oscillator that provides a maximum duty cycle signal comprising an on-state and an off-state;

a drive circuit that provides said drive signal according to said maximum duty cycle signal; and a soft start circuit means for providing a signal instructing said drive circuit to disable said drive signal during at least a portion of said on-state of said maximum duty cycle;

a rectifier comprising a rectifier input and a rectifier output, said rectifier input receiving an AC mains signal and said rectifier output providing a rectifier signal;

a power supply capacitor that receives said rectified signal;

a first winding comprising a first terminal and a second terminal, said first winding receiving a substantially DC signal from said power supply capacitor, said second terminal of said first winding coupled to said first terminal of said pulse width modulated switch; and a second winding magnetically coupled to said first winding, said first winding capable of being coupled to a load.

23. A power supply, comprising:

a regulation circuit comprising a first terminal;

a second terminal;

a switch comprising a control input, said switch allowing a signal to be transmitted between said first terminal and said second terminal according to a drive signal provided at said control input;

a drive circuit that provides said drive signal for a maximum time period of a cycle; and a soft start circuit means for providing a signal instructing said drive circuit to disable said drive signal during at least a portion of said maximum time period;

a rectifier comprising a rectifier input and a rectifier output, said rectifier input receiving an AC mains signal and said rectifier output providing a rectifier signal;

a power supply capacitor that receives said rectified signal;

a first winding comprising a first terminal and a second terminal, said first winding receiving a substantially DC signal from said power supply capacitor, said second terminal of said first winding coupled to said first terminal of said regulation circuit; and a second winding magnetically coupled to said first winding, said first winding capable of being coupled to a load.

\* \* \* \* \*